(12) United States Patent
Chan (10) Patent No.: US 11,889,631 B2
(45) Date of Patent: Jan. 30, 2024

(54) PRINTED CIRCUIT BOARD HOMOGENIZATION TREATMENT DEVICE

(71) Applicant: UNIVERSAL CIRCUIT BOARD EQUIPMENT CO., LTD., Dongguan (CN)

(72) Inventor: Takwo Chan, Dongguan (CN)

(73) Assignee: UNIVERSAL CIRCUIT BOARD EQUIPMENT CO., LTD., Dongguan (CN)

( * ) Notice: Subject to any disclaimer, the term of this patent is extended or adjusted under 35 U.S.C. 154(b) by 797 days.

(21) Appl. No.: 17/032,256

(22) Filed: Sep. 25, 2020

(65) Prior Publication Data

US 2022/0007557 A1 Jan. 6, 2022

Related U.S. Application Data

(63) Continuation of application No. PCT/CN2020/107622, filed on Aug. 7, 2020.

(30) Foreign Application Priority Data

Jul. 2, 2020 (CN) .......................... 202010627291.2

(51) Int. Cl.
*H05K 13/00* (2006.01)
*H05K 3/00* (2006.01)

(52) U.S. Cl.
CPC ....... *H05K 13/0069* (2013.01); *H05K 3/0085* (2013.01)

(58) Field of Classification Search
CPC ..... H05K 13/00; H05K 13/0069; H01L 23/32
See application file for complete search history.

(56) References Cited

U.S. PATENT DOCUMENTS 7,959,141 B2 * 6/2011 Makino ................. G03B 27/62
269/61
9,815,151 B2 * 11/2017 Simmons ........... B23K 37/0533
(Continued)

FOREIGN PATENT DOCUMENTS

CN 209089281 U 7/2019
CN 111083875 A 4/2020
(Continued)

OTHER PUBLICATIONS

First Office Action issued in counterpart Korean Patent Application No. 10-2020-7029817, dated Oct. 7, 2021.
(Continued)

*Primary Examiner* — Lee D Wilson
(74) *Attorney, Agent, or Firm* — Westbridge IP LLC (57) ABSTRACT

A printed circuit board homogenization treatment device includes a load mechanism, a position mechanism and a drive mechanism. The load mechanism is disk-shaped and configured to fix the printed circuit board; the position mechanism at least includes a first position wheel and a second position wheel that can jointly support the load mechanism; the position mechanism is switchable between a first state and a second state; when the position mechanism is in the first state, the load mechanism and the drive mechanism are spaced apart; when the position mechanism is in the second state, the drive mechanism is configured to drive the load mechanism to rotate around its central axis; both the first position wheel and the second position wheel are configured to rotate with rotation of the load mechanism.

20 Claims, 3 Drawing Sheets

(56) References Cited

U.S. PATENT DOCUMENTS 11,608,694 B2 *   3/2023   McCorriston ......... E21B 19/163
2022/0007557 A1 *   1/2022   Chan .................. H05K 13/0069

FOREIGN PATENT DOCUMENTS

| JP | H08150468 A | 6/1996 |
| KR | 100747513 B1 | 8/2007 |
| KR | 1020180059997 A | 6/2018 |

OTHER PUBLICATIONS

Written Opinion and International Search Report issued in corresponding PCT Application No. PCT/CN2020/107622, dated Mar. 30, 2021.

* cited by examiner

PRINTED CIRCUIT BOARD HOMOGENIZATION TREATMENT DEVICE

CROSS-REFERENCE TO RELATED APPLICATIONS

This application is a Continuation Application of PCT Application No. PCT/CN2020/107622, filed on Aug. 7, 2020, which claims priority to China Application No. 202010627291.2, filed on Jul. 2, 2020, entitled "PRINTED CIRCUIT BOARD HOMOGENIZATION TREATMENT DEVICE", the entire disclosure of which is incorporated herein by reference.

TECHNICAL FIELD

The present disclosure relates to the technical field of printed circuit board treatment device, in particular to a printed circuit board homogenization treatment device.

BACKGROUND

Nowadays, there are two types of printed circuit board treatment devices on the market: horizontal unit and vertical unit. The printed circuit board of the horizontal unit is placed horizontally on the conveying roller, and the surface of the printed circuit board directly contacts the conveying roller. During the conveying process, the conveying roller will form roller prints on the board surface, or cause serious scratches on the board surface, or reverse the coating of the board surface, which affects the processing effect of the printed circuit board. Therefore, the method of placing the printed circuit board horizontally for spraying or liquid treatment has relatively high requirements on the device, which increases the production cost. Meanwhile, the liquid medicine is prone to form a pool effect on the board surface (i.e., accumulation of water on the board surface), which affects the processing of the printed circuit board and is prone to quality problems.

However, the printed circuit board of the vertical unit is vertically clamped by the fixture and transported forward. When spraying the printed circuit board, the liquid medicine will flow downwards with gravity after being sprayed on the board surface, resulting in a difference in the time for the upper and lower parts of the board to contact the liquid medicine. As a result, the processing effects of the upper and lower parts of the printed circuit board are different, and defective products are prone to appear.

Therefore, how to ensure the uniformity of the surface treatment of the printed circuit board has become an urgent problem to be solved.

SUMMARY

The objective of the present disclosure is to provide a printed circuit board homogenization treatment device, which aims to solve the technical problem that in the related art, the uniformity of the surface treatment of the printed circuit board will occur when the printed circuit board is processed by the horizontal and vertical units.

The present disclosure provides a printed circuit board homogenization treatment device for processing a printed circuit board, including: a load mechanism, a position mechanism and a drive mechanism.

The load mechanism is disk-shaped and configured to fix the printed circuit board, and a central axis of the load mechanism extends in a horizontal direction to vertically arrange the printed circuit board; the position mechanism includes at least a first position wheel and a second position wheel; a rotation axis of the first position wheel and a rotation axis of the second position wheel both extend in a horizontal direction and are parallel to each other; the load mechanism is supported by the first position wheel and the second position wheel; the position mechanism is switchable between a first state and a second state; when the position mechanism is in the first state and the load mechanism is placed on the first position wheel and the second position wheel, the load mechanism and the drive mechanism are spaced apart; when the position mechanism is in the second state and the load mechanism is placed on the first position wheel and the second position wheel, the drive mechanism is configured to drive the load mechanism to rotate around the central axis of the load mechanism; both the first position wheel and the second position wheel are configured to rotate with rotation of the load mechanism.

In an embodiment, the first position wheel and the second position wheel are both on a same plane, and the rotation axis of the first position wheel is parallel to the central axis of the load mechanism.

In an embodiment, the first position wheel is switchable between a first pending position and a first operation position, and the second position wheel is switchable between a second pending position and a second operation position; and when the position mechanism is in the second state, the first position wheel is in the first operation position and the second position wheel is in the second operation position.

In an embodiment, when the position mechanism is in the first state, the first position wheel is in the first pending position and the second position wheel is in the second operation position.

In an embodiment, the first operation position is located above the first pending position, the second operation position is located above the second pending position, and the drive mechanism is located above the position mechanism.

In an embodiment, a height of the first position wheel in the first pending position is same as a height of the second position wheel in the second pending position, and a height of the first position wheel in the first operation position is same as a height of the second position wheel in the second operation position.

In an embodiment, the drive mechanism includes an active drive wheel; when the position mechanism is in the first state and the load mechanism is placed on the first position wheel and the second position wheel, the load mechanism and the active drive wheel are spaced apart; and when the position mechanism is in the second state and the load mechanism is placed on the first position wheel and the second position wheel, the active drive wheel abuts against the load mechanism and configured to drive the load mechanism to rotate.

In an embodiment, the drive mechanism further includes a drive motor and a conveyor belt, the conveyor belt is connected to the drive motor and the active drive wheel, and the drive motor is configured to drive the active drive wheel to rotate through driving the conveyor belt to move.

In an embodiment, the device further includes a limit wheel. The limit wheel is configured to abut against the load mechanism when the position mechanism is in the second state, and rotate with rotation of a load tray; and the limit wheel, the active drive wheel, the first position wheel and the second position wheel are configured to cooperatively limit the load mechanism to move.

In an embodiment, the device further includes a first support slide. The first position wheel and the second position wheel are sequentially located in an extension direction of the first support slide; the first support slide is configured to support the load tray; the load mechanism is configured to roll along the extension direction of the first support slide; and when the position mechanism is in the first state, the load mechanism is configured to roll from the first support slide to the first position wheel and the second position wheel.

In an embodiment, a height of the first position wheel in the first pending position is equal to or lower than a height of an end of the first support slide close to the first position wheel.

In an embodiment, the first support slide has a first inclined surface forming an angle with a horizontal plane; the load mechanism is abutted against the first inclined surface; and a height of an end of the first inclined surface away from the first position wheel is higher than a height of the end of the first inclined surface close to the first position wheel.

In an embodiment, the position mechanism also has a third state; and when the position mechanism is in the third state, the first position wheel is in the first operation position and the second position wheel is in the second pending position.

In an embodiment, the device further includes a second support slide. The second position wheel is located between the first position wheel and the second support slide; the second support slide is configured to support the load tray; a height of the second position wheel in the second pending position is equal to or higher than a height of an end of the second support slide close to the second position wheel; and when the position mechanism is in the third state, the load mechanism is configured to roll from the position mechanism to the second support slide, and roll along an extension direction of the second support slide.

In an embodiment, the second support slide has a second inclined surface forming an angle with a horizontal plane; the load mechanism is abutted against the second inclined surface; and a height of an end of the second inclined surface away from the second position wheel is higher than a height of an end of the second inclined surface close to the second position wheel.

In an embodiment, the load mechanism includes a load tray and a fixation member provided on the load tray and configured to fix the printed circuit board; and the drive mechanism is configured to drive the load tray to rotate around a central axis of the load tray, and the central axis of the load tray is perpendicular to the printed circuit board.

In an embodiment, the load tray has a first side surface, a second side surface and an edge surface; the first side surface is opposite to the second side surface; the edge surface circumferentially surrounds the first side surface and the second side surface and is away from the central axis of the load tray; and when the load mechanism is placed on the first position wheel and the second position wheel, both the first position wheel and the second position wheel are abutted against the edge surface.

In an embodiment, the load tray is provided with a through hole penetrating along the central axis of the load tray, the fixation member is configured to fix the load tray to the through hole, and the through hole is configured to avoid the printed circuit board.

In an embodiment, the device further includes a liquid treatment mechanism for soaking the printed circuit board in liquid.

In an embodiment, the device further includes an air blow mechanism for blowing air on the printed circuit board to dry the printed circuit board.

Compared with the related art, the technical effects of the present disclosure are: the printed circuit board is vertically arranged through fixing the load mechanism. When the position mechanism is in the second state, the drive mechanism can drive the load mechanism to rotate. The first position wheel and the second position wheel can rotate with the rotation of the load mechanism to realize the rotation of the load mechanism, and the printed circuit board rotates with the rotation of the load mechanism. After the surface of the printed circuit board is soaked in the liquid medicine, the liquid medicine will flow under the action of gravity or centrifugal force. The rotation of the printed circuit board can make the liquid medicine evenly distributed on the board surface, and the excess portion will drip or be thrown out to avoid the pool effect, which prevents the residual liquid medicine from causing excessive processing of the local area of the board surface, and meanwhile avoids the uneven processing effect of the liquid medicine on the upper and lower parts of the board surface when the printed circuit board is vertical.

BRIEF DESCRIPTION OF THE DRAWINGS

In order to more clearly illustrate the embodiments of the present disclosure, drawings used in the embodiments will be briefly described below. Obviously, the drawings in the following description are only some embodiments of the present disclosure. It will be apparent to those skilled in the art that other figures can be obtained according to the structures shown in the drawings without creative work.

DETAILED DESCRIPTION OF THE EMBODIMENTS

The embodiments of the present disclosure are described in detail below, and examples of the embodiments are shown in the drawings. The same or similar reference numerals indicate the same or similar elements or elements with the same or similar functions. The embodiments described below with reference to the drawings are exemplary, and are intended to explain the present disclosure, but should not be understood as a limitation to the present disclosure.

In the description of the present disclosure, it needs to be understood that the terms "up", "down", "front", "rear", "left", "right", "vertical", "horizontal", "inner", "outer", etc. indicate orientation or positional relationships based on the orientation or positional relationship shown in the drawings, are only for the convenience of describing the present disclosure and simplifying the description, rather than indicating or implying that the device or element referred to must have a specific orientation, be constructed and operated in a specific orientation, and therefore cannot be understood as a limitation of the present disclosure.

In this embodiment, according to the XYZ rectangular coordinate system as shown in in FIG. 1 to FIG. 3, it is defined as follows: a side in a positive direction of the X-axis is defined as the front, and a side in a negative direction of the X-axis is defined as the rear; a side in a positive direction of the Y-axis is defined as the left, and a side in a negative direction of the Y-axis is defined as the right; a side in a positive direction of the Z-axis is defined as up, and a side in a negative direction of the Z-axis is defined as down.

Besides, the terms "first", "second" and "third" are only used for descriptive purposes, and cannot be understood as indicating or implying relative importance or implicitly indicating the number of indicated technical features. Thus, the features defined with "first", "second", and "third" may explicitly or implicitly include one or more of these features. In the description of the present disclosure, "a plurality of" means two or more than two, unless otherwise specifically defined.

In the present disclosure, unless otherwise clearly specified and limited, the terms "install", "link", "connect", "fix" and other terms should be understood in a broad sense, for example, it can be a fixed connection, a detachable connection, or a whole; it can be a mechanical connection or an electrical connection; it can be directly connected, or indirectly connected through an intermediate medium, or it can be a communication between two elements or an interaction relationship between two elements. For those of ordinary skill in the art, the specific meanings of the above terms in the present disclosure can be understood according to specific circumstances.

As shown in the drawings, the present disclosure provides a printed circuit board homogenization treatment device for processing a printed circuit board, the printed circuit board is in a sheet shape and has a surface to be processed. The printed circuit board can have one surface to be processed or two opposite surfaces to be processed. It should be noted that the printed circuit board homogenization treatment device is particularly used for processing the surface to be processed to be infiltrated with the liquid medicine or the printed circuit board that has been soaked with the liquid medicine.

Figure 1:
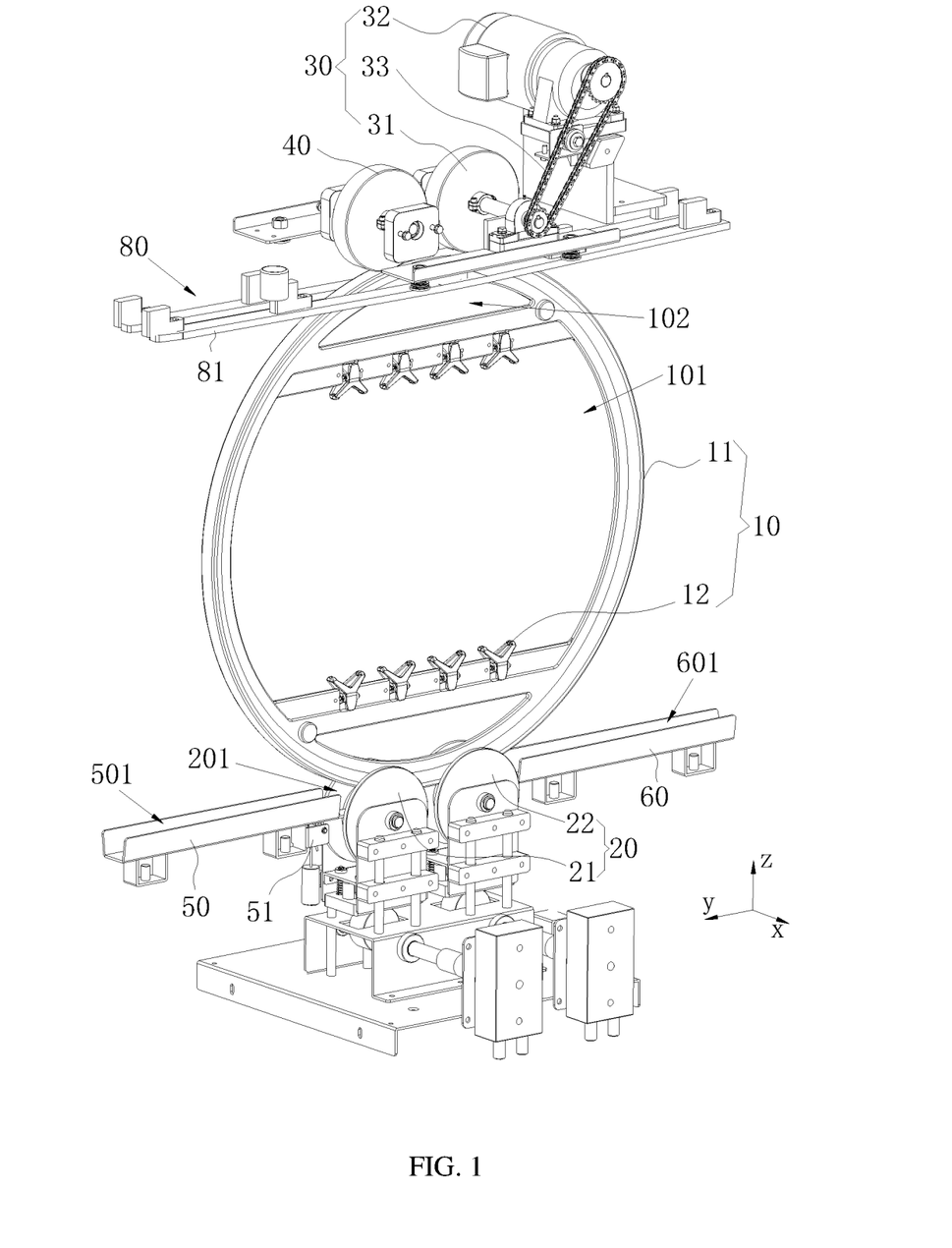
FIG. 1 is a perspective view of a printed circuit board homogenization treatment device according to an embodiment of the present disclosure, independent housing and spray mechanism are not shown.

As shown in FIG. 1, the printed circuit board homogenization treatment device includes a load mechanism 10, a drive mechanism 30, and a position mechanism 20.

The load mechanism 10 is configured to fix the printed circuit board, and a central axis of the load mechanism 10 extends in a horizontal direction to vertically arrange the printed circuit board. It can be understood that the vertical arrangement refers to making the surface to be processed of the printed circuit board perpendicular to the horizontal plane or substantially perpendicular to the horizontal plane. The surface to be processed of the printed circuit board can be flat or substantially flat. The load mechanism 10 is in the shape of a disc. It should be noted that the shape of the disc may be a disk-shaped or an elliptical disc shape. In an embodiment, the central axis of the load mechanism 10 is perpendicular to the surface to be processed of the printed circuit board. When the load mechanism 10 can rotate around its central axis, that is, its central axis is the axis of rotation, the printed circuit board can rotate with the rotation of the load mechanism 10.

As shown in FIG. 1, specially, the load mechanism 10 includes a load tray 11 and a fixation member 12 provided on the load tray 11 and configured to fix the printed circuit board. The load tray 11 is disk-shaped, and the load tray 11 has a first side surface, a second side surface, and an edge surface. The first side surface is opposite to the second side surface, and may be parallel to or substantially parallel to the second side surface. The center axis of the load tray 11 is the center axis of the load mechanism 10, and the edge surface circumferentially surrounds the first side surface and the second side surface and is away from the center axis. In an embodiment, both the first side surface and the second side surface are perpendicular to the horizontal plane, so that the edge surface has the same width. The fixation member 12 can tension the printed circuit board and make it flat, so as to avoid grooves on the surface to be processed and affect the flow of liquid medicine on the printed circuit board. In this embodiment, the fixation member 12 includes a plurality of fixtures connected to the load tray 11, and the plurality of fixtures are arranged along the circumference of the printed circuit board to uniformly fix the printed circuit board. The fixation member 12 can suspend the printed circuit board in the air, and can also attach the printed circuit board to the first side surface or the second side surface of the load tray 11 with the side to be processed facing outwards to facilitate the treatment of the liquid medicine. In this embodiment, The load tray 11 is provided with a through hole 101 penetrating along the rotation axis. The fixation member 12 is configured to fix the printed circuit board to the through hole 101, and the through hole 101 avoids the surface to be processed. In this way, the two surfaces to be processed of the printed circuit board are not blocked or touched by the load tray 11, which facilitates other processing procedures on the printed circuit board in the later stage. The load tray 11 is also provided with an escape hole 102 to facilitate the external device to pick up and hang the load tray 11. It should be noted that, in this embodiment, the rotation of the load tray 11 refers to the rotation of the load tray 11 around its central axis.

As shown in FIG. 1, the position mechanism 20 at least includes a first position wheel 21 and a second position wheel 22. In this embodiment, the position mechanism 20 only includes a first position wheel 21 and a second position wheel 22. In other embodiments, the position mechanism 20 may further include other position wheels capable of positioning the load tray 11.

The rotation axis of the first position wheel 21 and the rotation axis of the second position wheel 22 both extend in the horizontal direction and are parallel to each other. The first position wheel 21 and the second position wheel 22 can jointly support the load mechanism 10. It is understandable that the load tray 11 can be placed on the first position wheel 21 and the second position wheel 22, that is, its edge surface can abut against the first position wheel 21 and the second position wheel 22. In this embodiment, the first position wheel 21 and the second position wheel 22 are located on a same plane. The rotation axis of the first position wheel 21 is parallel to the central axis of the load mechanism 10 to facilitate the alignment and rotation of the load tray 11. In other embodiments, the first position wheel 21 and the second position wheel 22 may not be located on the same plane.

The position mechanism 20 can switch between a first state and a second state. When the load mechanism 10 is placed on the first position wheel 21 and the second position wheel 22, the position mechanism 20 is in the first state, the load mechanism 10 and the drive mechanism are spaced apart, that is, the load mechanism 10 is not driven or controlled by the drive mechanism 30. When the position mechanism 20 is in the second state, the drive mechanism 30 can drive the load mechanism 10 to rotate around its central axis, that is, when the position mechanism 20 is in the second state, the first position wheel 21 and the second position wheel 22 can jointly make the load tray 11 contact the drive mechanism 30 so that the drive mechanism 30 can drive the load tray 11 to rotate. When the load tray 11 rotates, both the first position wheel 21 and the second position wheel 22 can rotate with the rotation of the load mechanism 10, that is, the first position wheel 21 and the second position wheel 22 are both driven wheels of the load tray 11. It should be noted that when the position mechanism 20 is in the second state, the first position wheel 21 and the second position wheel 22 can position the load tray 11 to limit its radial movement. Alternatively, the first position wheel 21, the second position wheel 22 and the drive mechanism 30 jointly position the load tray 11 to restrict its radial movement. The position of the drive mechanism 30 can be fixed, or can be moved to contact or separate from the load tray 11.

The printed circuit board is vertically arranged through the fixing of the load mechanism 10. When the position mechanism 20 is in the second state, the drive mechanism 30 can drive the load mechanism 10 to rotate. The first position wheel 21 and the second position wheel 22 can rotate with the rotation of the load mechanism 10 to realize the rotation of the load mechanism 10, and the printed circuit board rotates with the rotation of the load mechanism 10. After the surface of the printed circuit board is soaked in the liquid medicine, the liquid medicine will flow under the action of gravity or centrifugal force. The rotation of the printed circuit board can make the liquid medicine evenly distributed on the board surface, and the excess portion will drip or be thrown out to avoid the pool effect, which prevents the residual liquid medicine from causing excessive processing of the local area of the board surface, and meanwhile avoids the uneven processing effect of the liquid medicine on the upper and lower parts of the board surface when the printed circuit board is vertical.

The first position wheel 21 can switch between a first pending position and a first operation position, and the second position wheel 22 can switch between a second pending position and a second operation position. When the position mechanism 20 is in the second state, the first position wheel 21 is in the first operation position and the second position wheel 22 is in the second operation position. That is, when the position mechanism 20 is switchable between the first state and the second state, the first position wheel 21 is switchable between the first pending position and the first operation position, and/or, the second position wheel 22 is switchable between the second pending position and the second operation position. When the position of the first position wheel 21 or the second position wheel 22 changes, the position of the load tray 11 will also change to achieve contact or separation with the drive mechanism 30.

In an embodiment, when the position mechanism 20 is in the first state, the first position wheel 21 is in the first pending position and the second position wheel 22 is in the second pending position. That is, when the position mechanism 20 is switchable from the first state to the second state, the first position wheel 21 is switchable from the first pending position to the first operation position, the second position wheel 22 is switchable from the second pending position to the second operation position to change the position of the load tray 11 to make it contact with the drive mechanism 30.

In this embodiment, when the position mechanism 20 is in the first state, the first position wheel 21 is in the first pending position and the second position wheel 22 is in the second operation position. That is, when the position mechanism 20 is switchable from the first state to the second state, the first position wheel 21 is switchable from the first pending position to the first operation position, and the second position wheel 22 remains unchanged at the second operation position. In this way, the load tray 11 can be moved to a position where it abuts against the drive mechanism 30 by switching the position of the first position wheel 21, and the second position wheel 22 serves as a limiter.

In this embodiment, the first operation position is located above the first pending position, the second operation position is located above the second pending position, and the drive mechanism 30 is located above the position mechanism 20. When the position mechanism 20 is switchable from the first state to the second state, the position mechanism 20 can lift up the load tray 11 so as to contact the drive mechanism 30. When the position mechanism 20 is switchable from the second state to the first state, the position mechanism 20 can lower the load tray 11 to disengage from the drive mechanism 30.

As shown in FIG. 1, a height of the first position wheel 21 in the first pending position is same as a height of the second position wheel 22 in the second pending position, and a height of the first position wheel 21 in the first operation position is same as a height of the second position wheel 22 in the second operation position. When the position mechanism 20 is in the first state, the load tray 11 can be horizontally moved from the side to the first position wheel 21, the second position wheel 22 is now in the moving direction of the first position wheel 21 to restrict the first position wheel 21 from continuing to move. The above movement can be translation or scrolling. When the load tray 11 rolls onto the first position wheel 21 and abuts against the second position wheel 22, the first position wheel 21 and the second position wheel 22 rotate with the rotation of the load tray 11. When the position mechanism 20 is in the second state, the first position wheel 21 lifts the load tray 11 until the first position wheel 21 is flush with the second position wheel 22, and the lowest point of the load tray 11 is located between the first position wheel 21 and the second position wheel 22 in the vertical direction, and the highest points of the first position wheel 21 and the second position wheel 22 are both higher than the lowest point of the load tray 11. In this way, the first position wheel 21 and the second position wheel 22 both play a limiting role on the load tray 11, restricting the radial rolling of the load tray 11, so as to realize the rotation of the load tray 11 when the drive mechanism 30 drives the load tray 11 to rotate.

In other embodiments, the height of the first position wheel 21 and the height of the second position wheel 22 may also be different when the position mechanism 20 is in the second state.

As shown in FIG. 1, the drive mechanism 30 includes an active drive wheel 31, a drive motor 32 and a conveyor belt 33. The conveyor belt 33 is connected to the drive motor 32 and the drive wheel 31, and the drive motor 32 can drive the drive wheel 31 to rotate by driving the conveyor belt 33 to move. When the position mechanism 20 is in the first state and the load mechanism 10 is placed on the first position wheel 21 and the second position wheel 22, the load mechanism 10 and the drive wheel 31 are spaced apart. When the position mechanism 20 is in the second state and the load mechanism 10 is placed on the first position wheel 21 and the second position wheel 22, the active drive wheel 31 can abut against the load mechanism 10 and drive the load mechanism 10 to rotate. In this way, the active drive wheel 31 drives the load tray 11 to rotate, thereby realizing the rotation of the load tray 11. The active drive wheel 31 can abut against the highest point of the load tray 11 or against the side of the load tray 11. When the position mechanism 20 is in the second state, the active drive wheel 31, the first position wheel 21 and the second position wheel 22 can jointly limit the radial movement of the load tray 11 to prevent the load tray 11 from separating from the position mechanism 20. The active drive wheel 31 and the drive motor 32 are connected through a conveyor belt 33, and the speed ratio can be changed to form a reducer to reduce the speed of the drive motor 32 to the active drive wheel 31.

As shown in FIG. 1, in order to further limit the position of the load tray 11, the printed circuit board homogenization treatment device further includes a limit wheel 40. The limit wheel 40 can abut against the load mechanism 10 when the position mechanism 20 is in the second state, and can rotate with the rotation of the load tray 11. In addition, the limit wheel 40, the active drive wheel 31, the first position wheel 21 and the second position wheel 22 can jointly limit the displacement of the load mechanism 10. Understandably, when the position mechanism 20 is switchable from the first state to the second state, the load tray 11 is lifted upwards and abuts against the active drive wheel 31 and the limit wheel 40. The highest point of the load tray 11 is located between the drive wheel 31 and the limit wheel 40. In this way, the active drive wheel 31 and the limit wheel 40 from above, and the first position wheel 21 and the second position wheel 22 from below, jointly clamp the load tray 11 to further restrict the radial movement of the load mechanism 10.

After the processing of the printed circuit board is completed, the position mechanism 20 also has a third state, so that the load tray 11 and the drive wheel 31 are separated again and removed from the position mechanism 20. In this embodiment, when the position mechanism 20 is in the third state, the first position wheel 21 is in the first operation position and the second position wheel 22 is in the second pending position. The position mechanism 20 can be switchable from the second state to the third state, that is, the first position wheel 21 is kept at the first operation position, the second position wheel 22 is switchable from the second operation position to the first pending position, and the load tray 11 is lowered, meanwhile, due to the height difference between the first position wheel 21 and the second position wheel 22, the first position wheel 21 generates a horizontal support force on the load tray 11. The load tray 11 is rolled in the direction from the first position wheel 21 to the second position wheel 22, so that the load tray 11 is rolled down from the position mechanism 20 and enters the next process. In this way, the position mechanism 20 realizes the positioning processing and automatic conveying of the load tray 11 through the change of the positions of the first position wheel 21 and the second position wheel 22.

It should be noted that the load tray 11 can be placed on the position mechanism 20 in the first state and start to rotate after being driven by the drive mechanism 30, or it can rotate all the time, and the drive mechanism 30 drives it to continue to rotate in the same direction.

As shown in FIG. 1, in order to transport the load tray 11 to the position mechanism 20, the printed circuit board homogenization treatment device further includes a first support slide 50, The first position wheel 21 and the second position wheel 22 are sequentially located in the extension direction of the first support slide 50, that is, the first position wheel 21 is located between the first support slide 50 and the second position wheel 22, and the first support slide 50 is used to support the load tray 11. The load mechanism 10 can be placed on the first support slide 50 and roll along the extension direction of the first support slide 50. When the position mechanism 20 is in the first state, the load mechanism 10 can be rolled from the first support slide 50 to the first position wheel 21 and the second position wheel 22. The first support slide 50 plays a guiding role, and the load tray 11 can roll on the first support slide 50 by inertia and roll to the position mechanism 20 in the first state under the action of inertia. At this time, the second position wheel 22 is in the second operation position, which can restrict the continuous rolling of the load tray 11, When the position mechanism 20 is switched to the second state, the first position wheel 21 is switched to the first operation position, and the drive mechanism 30 drives the load tray 11 to continue to rotate in the same direction. For example, as shown in the figure, when the first position wheel 21 is located on the left side and the second position wheel 22 is located on the right side, the first support slide 50 is located on the left side of the first position wheel 21, the load tray 11 rolls clockwise on the first support slide 50, and the drive mechanism 30 can drive the load tray 11 to continue to rotate clockwise.

In order to facilitate the smooth rolling of the load tray 11 from the first support slide 50 to the first position wheel 21, the height of the first position wheel 21 in the first pending position is equal to or lower than the height of an end of the first supporting slide 50 close to the first position wheel 21. In this way, the load tray 11 rolls out along a parabola from the first support slide 50 close to the end of the first positioning wheel 21 under the action of inertial force and gravity. When the position mechanism 20 is in the first state, the height of the first position wheel 21 can cause the load tray 11 to fall above it or move to the top and contact the second position wheel 22.

The load tray 11 can be rolled by external force on the first support slide 50. In this embodiment, the first support slide 50 has a first inclined surface that forms an angle with a horizontal plane. The load mechanism 10 abuts against the first inclined surface, and a height of the end of the first inclined surface away from the first position wheel 21 is higher than a height of the end of the first inclined surface close to the first position wheel 21. That is, the first inclined surface is an inclined surface extending diagonally downward towards the first position wheel 21. The load tray 11 can automatically accelerate to roll towards the first position wheel 21 due to gravity on the first support slide 50, which reduces the energy consumption of the required external force.

As shown in FIG. 1, in order to prevent the load tray 11 moving on the position mechanism 20 from falling back to the first support slide 50, a check valve 51 is provided at the first support slide 50 close to the end of the first position wheel 21. The check valve 51 can allow the load tray 11 to slide from the first support slide 50 towards the first position wheel 21 and restrict the first position wheel 21 of the load tray 11 to return to the first support slide 50.

As shown in FIG. 1, in order to enable the printed circuit board to enter the next process after the processing is completed, the printed circuit board homogenization treatment device further includes a second support slide 60. The support mechanism is located between the first support slide 50 and the second support slide 60. The second position wheel 22 is located between the first position wheel 21 and the second support slide 60. The second support slide 60 is configured to support the load tray 11. A height of the second position wheel 22 in the second pending position is equal to or higher than a height of the second support slide 60 close to an end of the second position wheel 22. When the position mechanism 20 is in the third state, the load mechanism 10 is rolled from the position mechanism 20 to the second support slide 60, and is rolled along an extension direction of the second support slide 60. In this way, when the position mechanism 20 is switched to the third state, the load tray 11 is pushed by the first position wheel 21 to roll to the second support slide 60, and continues to roll on the second support slide 60 along the extension direction of the second support slide 60.

The second support slide 60 has a second inclined surface that forms an angle with a horizontal plane. The load mechanism 10 abuts against the second inclined surface. A height of an end of the second inclined surface away from the second position wheel 22 is higher than a height of an end of the second inclined surface close to the second position wheel 22. That is, the second inclined surface is an inclined surface extending obliquely downward facing away from the second position wheel 22. After the load tray 11 moves to the second inclined surface, it is automatically accelerated to roll away from the position mechanism 20 under the action of gravity, so as to enter the next process, which saves energy consumption.

When the printed circuit board homogenization treatment device is working, the load tray 11 rolls on the first support slide 50. At this time, the position mechanism 20 is in the first state, the load tray 11 rolls onto the first position wheel 21 under the action of gravity, and the second position wheel 22 restricts the load tray 11 to continue rolling. In this embodiment, a sensing mechanism may be provided, and the position mechanism 20 is switchable from the first state to the second state after the sensing mechanism senses that the load tray 11 is located at the preset position. The load tray 11 is lifted to the active drive wheel 31, and the drive motor 32 drives the active drive wheel 31 to rotate, thereby driving the load tray 11 to rotate. The first position wheel 21 and the second position wheel 22 rotate with the rotation of the load tray 11, and the load tray 11 can rotate to perform uniform liquid treatment on the printed circuit board. After the homogenization process is completed, the position mechanism 20 is switchable from the second state to the third state, and the second position wheel 22 is lowered to the second pending position. Under the supporting force of the first position wheel 21, the load tray 11 rolls down from the position mechanism 20 and rolls onto the second support slide 60. The load tray 11 continues to roll on the second support slide 60 under the action of gravity and has reached the next station.

As shown in FIG. 1, in order to restrict the axial movement of the load tray 11, a side wall of at least one of the first position wheel 21, the second position wheel 22, the drive wheel 31 and the limit wheel 40 is provided with a ring groove 201. The load tray 11 is limited in the ring groove 201, and the groove wall of the ring groove 201 can play a limiting role. The first support slide 50 is provided with a first slide groove 501, and the second support slide 60 is provided with a second slide groove 601. The load tray 11 rolls in the first slide groove 501 and the second slide groove 601, and a groove wall of the first slide groove 501 and a groove wall of the second slide groove 601 can play a limiting role. In an embodiment, the printed circuit board homogenization treatment device may also include other independently limit mechanisms 80. The limit mechanism 80 can limit the axial skew or displacement of the load tray 11. The limit mechanism 80 may include two limit members 81, and the two limit members 81 are respectively located on both sides of the axial direction of the load tray 11.

Figure 2:
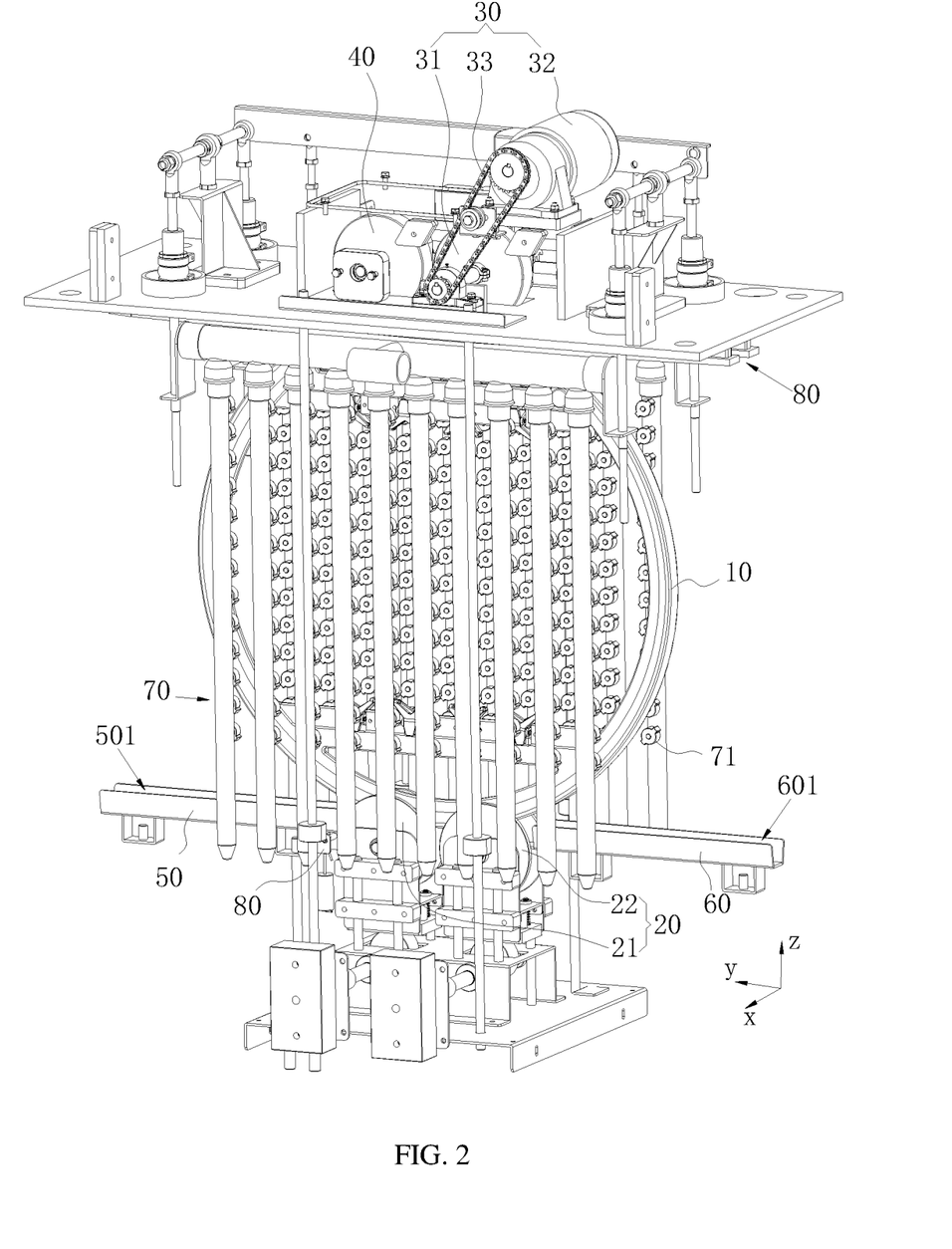
FIG. 2 is a perspective view of the printed circuit board homogenization treatment device according to an embodiment of the present disclosure, independent housing is not shown.

As shown in FIG. 2, the printed circuit board homogenization treatment device further includes a liquid treatment mechanism for soaking the surface to be processed with liquid. The liquid treatment mechanism makes the surface to be processed soak the liquid again, so that the load tray 11 can perform homogenization processing with the printed circuit board again. It can be understood that in the process of further infiltrating the liquid, the load tray 11 rotates again to uniformly distribute the liquid on the surface to be treated, so that the treatment effect of the surface to be treated is uniform. The infiltrating method can be soaking or spraying. The liquid can be liquid medicine to treat the printed circuit board, or it can be clean water to clean the printed circuit board.

As shown in FIG. 2, the liquid treatment mechanism includes a circulation pipe and a nozzle 71 connected to the flow pipe and facing the load tray 11. The circulation tube provides a flow channel for the liquid, and the nozzle 71 can spray the liquid in the circulation tube onto the load tray 11. In an embodiment, the circulation pipe extends laterally, and multiple nozzles 71 are provided and arranged in an array along an extension direction of the circulation pipe.

The printed circuit board homogenization processing device also includes an air blow mechanism for blowing air on the surface to be processed to dry the surface to be processed. The air blow mechanism is used to blow the surface to be treated evenly to make the drying effect even.

Figure 3:
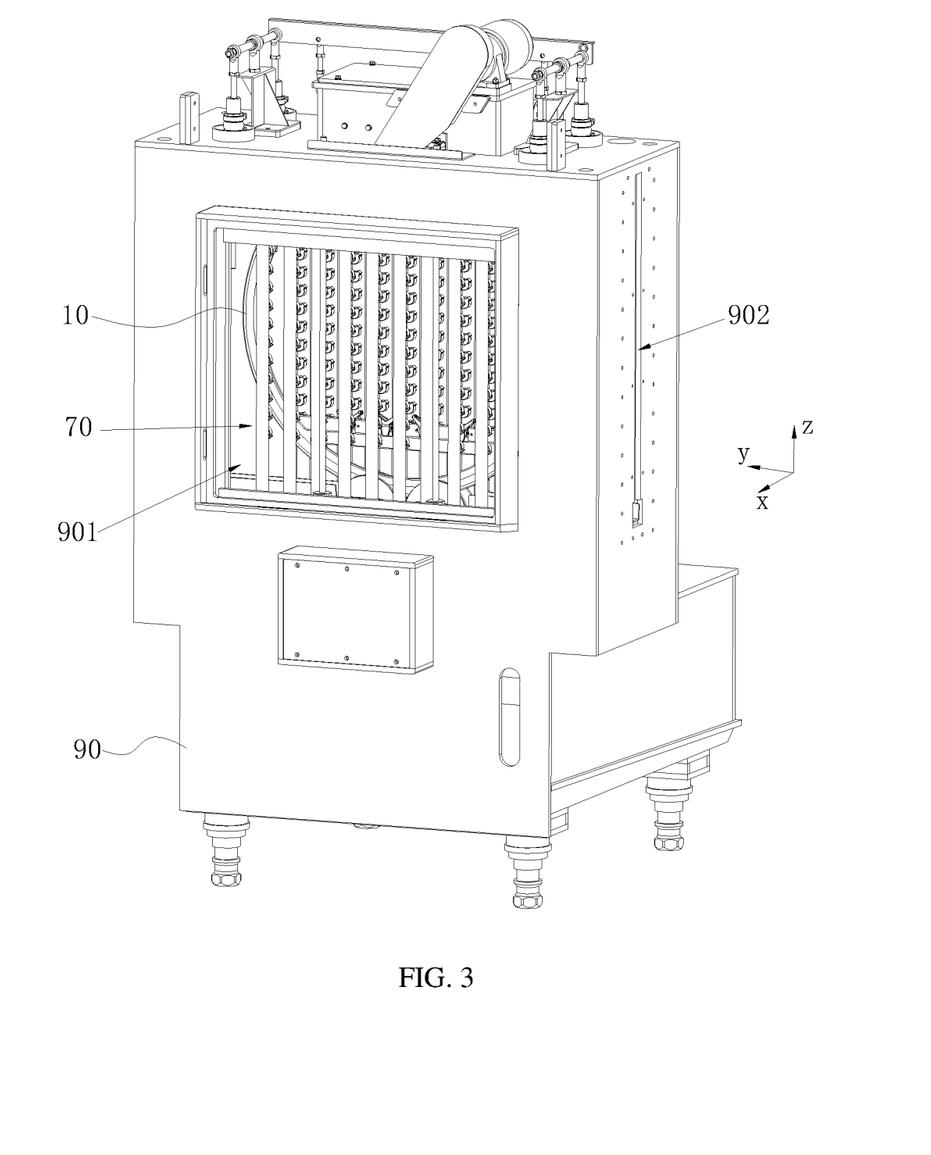
FIG. 3 is a perspective view of the printed circuit board homogenization treatment device according to an embodiment of the present disclosure.

As shown in FIG. 3, the printed circuit board homogenization treatment device may also include an independent housing 90. The independent housing 90 has an accommodation cavity 901 and is provided with a delivery hole 902 communicating with the accommodation cavity 901. The accommodation cavity 901 is used for accommodating the position mechanism 20, the drive mechanism 30, the first support slide 50, the second support slide 60, the limit wheel 40, the spray mechanism 70 or the air blow mechanism, and the limit mechanism 80. The delivery hole 902 is used for conveying the load tray 11 from the outside into the accommodation cavity 901 and rolling on the first support slide 50, and/or the load tray 11 rolls out of the accommodation cavity 901 from the accommodation cavity 901 along the second support slide 60.

The printed circuit board homogenization treatment device can be provided with multiple stations. In this embodiment, a printed circuit board homogenization treatment device is provided with a station. Specifically, there are at least three stations on a printed circuit board production line, that is, three printed circuit board homogenization treatment devices.

A liquid treatment mechanism is provided in a first station, and the liquid treatment mechanism is used to spray the liquid medicine on the surface to be treated so that the surface to be treated is processed. By rotating the load tray 11, the liquid medicine on the surface to be treated is evenly distributed, so that the treatment effect of the surface to be treated is uniform.

Another liquid treatment mechanism is provided in a second station. When the load tray 11 is transported to the second station, the liquid treatment mechanism is used to spray cleaning liquid on the surface to be treated to clean the surface to be treated. The cleaning fluid can be clean water to clean the surface to be processed that has been further processed.

A third station is equipped with an air blow mechanism. When the load tray 11 is transported to the third station, the air blow mechanism blows air to the surface to be treated, and the drive mechanism 30 drives the load tray 11 to rotate so that the surface to be treated is evenly dried.

Both the liquid treatment mechanism and the air blow mechanism can be fixed on a station, so that the load tray 11 performs further homogenization or drying treatment when moving to this station.

The above are only preferred embodiments of the present disclosure, and are not intended to limit the present disclosure. Any modification, equivalent replacement and improvement made within the spirit and principle of the present disclosure shall be included in the protection scope of the present disclosure

What is claimed is:

1. A printed circuit board homogenization treatment device for processing a printed circuit board, comprising: a load mechanism, a position mechanism and a drive mechanism, wherein:
the load mechanism is disk-shaped and configured to fix the printed circuit board, and a central axis of the load mechanism extends in a horizontal direction to vertically arrange the printed circuit board;
the position mechanism comprises at least a first position wheel and a second position wheel;
a rotation axis of the first position wheel and a rotation axis of the second position wheel both extend in a horizontal direction and are parallel to each other;
the load mechanism is supported by the first position wheel and the second position wheel;
the position mechanism is switchable between a first state and a second state;
when the position mechanism is in the first state and the load mechanism is placed on the first position wheel and the second position wheel, the load mechanism and the drive mechanism are spaced apart;
when the position mechanism is in the second state and the load mechanism is placed on the first position wheel and the second position wheel, the drive mechanism is configured to drive the load mechanism to rotate around the central axis of the load mechanism;
both the first position wheel and the second position wheel are configured to rotate with rotation of the load mechanism.

2. The printed circuit board homogenization treatment device of claim 1, wherein the first position wheel and the second position wheel are both on a same plane, and the rotation axis of the first position wheel is parallel to the central axis of the load mechanism.

3. The printed circuit board homogenization treatment device of claim 1, wherein:
the first position wheel is switchable between a first pending position and a first operation position, and the second position wheel is switchable between a second pending position and a second operation position; and
when the position mechanism is in the second state, the first position wheel is in the first operation position and the second position wheel is in the second operation position.

4. The printed circuit board homogenization treatment device of claim 3, wherein when the position mechanism is in the first state, the first position wheel is in the first pending position and the second position wheel is in the second operation position.

5. The printed circuit board homogenization treatment device of claim 3, wherein the first operation position is located above the first pending position, the second operation position is located above the second pending position, and the drive mechanism is located above the position mechanism.

6. The printed circuit board homogenization treatment device of claim 5, wherein a height of the first position wheel in the first pending position is same as a height of the second position wheel in the second pending position, and a height of the first position wheel in the first operation position is same as a height of the second position wheel in the second operation position.

7. The printed circuit board homogenization treatment device of claim 5, wherein:
the drive mechanism comprises an active drive wheel;
when the position mechanism is in the first state and the load mechanism is placed on the first position wheel and the second position wheel, the load mechanism and the active drive wheel are spaced apart; and
when the position mechanism is in the second state and the load mechanism is placed on the first position wheel and the second position wheel, the active drive wheel abuts against the load mechanism and configured to drive the load mechanism to rotate.

8. The printed circuit board homogenization treatment device of claim 7, wherein the drive mechanism further comprises a drive motor and a conveyor belt, the conveyor belt is connected to the drive motor and the active drive wheel, and the drive motor is configured to drive the active drive wheel to rotate through driving the conveyor belt to move.

9. The printed circuit board homogenization treatment device of claim 8, further comprising a limit wheel, wherein:
the limit wheel is configured to abut against the load mechanism when the position mechanism is in the second state, and rotate with rotation of a load tray; and
the limit wheel, the active drive wheel, the first position wheel and the second position wheel are configured to cooperatively limit the load mechanism to move.

10. The printed circuit board homogenization treatment device of claim 3, further comprising a first support slide, wherein:
the first position wheel and the second position wheel are sequentially located in an extension direction of the first support slide;
the first support slide is configured to support the load tray;
the load mechanism is configured to roll along the extension direction of the first support slide; and
when the position mechanism is in the first state, the load mechanism is configured to roll from the first support slide to the first position wheel and the second position wheel.

11. The printed circuit board homogenization treatment device of claim 10, wherein a height of the first position wheel in the first pending position is equal to or lower than a height of an end of the first support slide close to the first position wheel.

12. The printed circuit board homogenization treatment device of claim 11, wherein:
the first support slide has a first inclined surface forming an angle with a horizontal plane;
the load mechanism is abutted against the first inclined surface; and
a height of an end of the first inclined surface away from the first position wheel is higher than a height of the end of the first inclined surface close to the first position wheel.

13. The printed circuit board homogenization treatment device of claim 3, wherein:
the position mechanism also has a third state; and when the position mechanism is in the third state, the first position wheel is in the first operation position and the second position wheel is in the second pending position.

14. The printed circuit board homogenization treatment device of claim 13, further comprising a second support slide, wherein:
the second position wheel is located between the first position wheel and the second support slide;
the second support slide is configured to support the load tray;
a height of the second position wheel in the second pending position is equal to or higher than a height of an end of the second support slide close to the second position wheel; and
when the position mechanism is in the third state, the load mechanism is configured to roll from the position mechanism to the second support slide, and roll along an extension direction of the second support slide.

15. The printed circuit board homogenization treatment device of claim 14, wherein:
the second support slide has a second inclined surface forming an angle with a horizontal plane;
the load mechanism is abutted against the second inclined surface; and
a height of an end of the second inclined surface away from the second position wheel is higher than a height of an end of the second inclined surface close to the second position wheel.

16. The printed circuit board homogenization treatment device of claim 1, wherein:
the load mechanism comprises a load tray and a fixation member provided on the load tray and configured to fix the printed circuit board; and
the drive mechanism is configured to drive the load tray to rotate around a central axis of the load tray, and the central axis of the load tray is perpendicular to the printed circuit board.

17. The printed circuit board homogenization treatment device of claim 16, wherein:
the load tray has a first side surface, a second side surface and an edge surface;
the first side surface is opposite to the second side surface;
the edge surface circumferentially surrounds the first side surface and the second side surface and is away from the central axis of the load tray; and
when the load mechanism is placed on the first position wheel and the second position wheel, both the first position wheel and the second position wheel are abutted against the edge surface.

18. The printed circuit board homogenization treatment device of claim 16, wherein the load tray is provided with a through hole penetrating along the central axis of the load tray, the fixation member is configured to fix the load tray to the through hole, and the through hole is configured to avoid the printed circuit board.

19. The printed circuit board homogenization treatment device of claim 1, further comprising:
a liquid treatment mechanism for soaking the printed circuit board in liquid.

20. The printed circuit board homogenization treatment device of claim 1, further comprising:
an air blow mechanism for blowing air on the printed circuit board to dry the printed circuit board.

* * * * *